United States Patent
Halliyal et al.

(10) Patent No.: US 6,642,573 B1
(45) Date of Patent: Nov. 4, 2003

(54) USE OF HIGH-K DIELECTRIC MATERIAL IN MODIFIED ONO STRUCTURE FOR SEMICONDUCTOR DEVICES

(75) Inventors: Arvind Halliyal, Cupertino, CA (US); Mark T. Ramsbey, Sunnyvale, CA (US); Wei Zhang, Sunnyvale, CA (US); Mark W. Randolph, San Jose, CA (US); Fred T. K. Cheung, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/097,912

(22) Filed: Mar. 13, 2002

(51) Int. Cl.$^7$ .................... H01L 29/788; H01L 21/8247
(52) U.S. Cl. ...................... 257/316; 438/261; 438/785; 438/954
(58) Field of Search ................... 257/316; 438/261, 438/954, 763, 785

(56) References Cited

U.S. PATENT DOCUMENTS

| | | | | |
|---|---|---|---|---|
| 5,043,940 A | * | 8/1991 | Harari | 365/185.03 |
| 5,120,672 A | * | 6/1992 | Mitchell et al. | 438/261 |
| 5,888,870 A | * | 3/1999 | Gardner et al. | 438/261 |
| 6,008,091 A | * | 12/1999 | Gregor et al. | 438/261 |
| 6,013,553 A | | 1/2000 | Wallace et al. | 438/287 |
| 6,163,049 A | | 12/2000 | Bui | 257/321 |
| 6,171,900 B1 | * | 1/2001 | Sun | 438/240 |
| 6,242,306 B1 | | 6/2001 | Pham et al. | 438/262 |
| 6,309,927 B1 | | 10/2001 | Au et al. | 438/261 |
| 6,438,030 B1 | | 8/2002 | Hu et al. | 365/185.18 |
| 6,461,905 B1 | | 10/2002 | Wang et al. | 438/183 |
| 2002/0106536 A1 | | 8/2002 | Lee et al. | 428/702 |
| 2002/0115252 A1 | | 8/2002 | Haukka et al. | 438/240 |
| 2002/0142624 A1 | | 10/2002 | Levy et al. | 438/786 |
| 2002/0190311 A1 | | 12/2002 | Blomme et al. | 257/321 |

* cited by examiner

Primary Examiner—Richard Booth
(74) Attorney, Agent, or Firm—Renner, Otto, Boisselle & Sklar, LLP

(57) ABSTRACT

A process for fabrication of a semiconductor device including a modified ONO structure, comprising forming the modified ONO structure by providing a semiconductor substrate; forming a first dielectric material layer on the semiconductor substrate; depositing a silicon nitride layer on the first dielectric material layer; and forming a top dielectric material layer, wherein at least one of the bottom dielectric material layer and the top dielectric material layer comprise a mid-K or a high-K dielectric material. The semiconductor device may be, e.g., a SONOS two-bit EEPROM device or a floating gate flash device including the modified ONO structure.

22 Claims, 4 Drawing Sheets

USE OF HIGH-K DIELECTRIC MATERIAL IN MODIFIED ONO STRUCTURE FOR SEMICONDUCTOR DEVICES

TECHNICAL FIELD

The present invention relates to a process for preparation of a semiconductor device including forming a modified ONO structure. The modified ONO structure comprises a high-K dielectric material.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, flash EEPROM devices enable the erasing of all memory cells in the device using a single electrical current pulse.

Product development efforts in EEPROM device technology have focused on increasing the programming speed, lowering programming and reading voltages, increasing data retention time, reducing cell erasure times and reducing cell dimensions. One important dielectric material for the fabrication of the EEPROM is an oxide-nitride-oxide (ONO) structure. One EEPROM device that utilizes the ONO structure is a silicon-oxide-nitride-oxide-silicon (SONOS) type cell. A second EEPROM device that utilizes the ONO structure is a floating gate flash memory device, in which the ONO structure is formed over the floating gate, typically a polysilicon floating gate.

In SONOS devices, during programming, electrical charge is transferred from the substrate to the silicon nitride layer in the ONO structure. Voltages are applied to the gate and drain creating vertical and lateral electric fields, which accelerate the electrons along the length of the channel. As the electrons move along the channel, some of the electrons gain sufficient energy to jump over the potential barrier of the bottom silicon dioxide layer and become trapped in the silicon nitride layer. Electrons are trapped near the drain region because the electric fields are the strongest near the drain. Reversing the potentials applied to the source and drain will cause electrons to travel along the channel in the opposite direction and be injected into the silicon nitride layer near the source region. Because silicon nitride is not electrically conductive, the charge introduced into the silicon nitride layer tends to remain localized. Accordingly, depending upon the application of voltage potentials, electrical charge can be stored in discrete regions within a single continuous silicon nitride layer.

Non-volatile memory designers have taken advantage of the localized nature of electron storage within a silicon nitride layer and have designed memory circuits that utilize two regions of stored charge within an ONO layer. This type of non-volatile memory device is known as a two-bit EEPROM, which is available under the trademark MIRRORBIT™ from Advanced Micro Devices, Inc., Sunnyvale, Calif. The MIRRORBIT™ two-bit EEPROM is capable of storing twice as much information as a conventional EEPROM in a memory array of equal size. A left and right bit is stored in physically different areas of the silicon nitride layer, near left and right regions of each memory cell. Programming methods are then used that enable two bits to be programmed and read simultaneously. The two-bits of the memory cell can be individually erased by applying suitable erase voltages to the gate and to either the source or drain regions.

As device dimensions continue to be reduced, the electrical thickness of the ONO layer must be reduced accordingly. Previously, this has been accomplished by scaling down the physical thickness of the ONO layer. However, as the ONO layer is made physically thinner, leakage current through the ONO layer may increase, and the charge trapping ability of the nitride layer may be reduced, which limits the scaling down of the total physical thickness of the ONO layer.

A floating gate flash device includes a floating gate electrode upon which electrical charge is stored. The floating gate electrode is formed on a tunnel oxide layer which overlies a channel region residing between the source and drain regions in a semiconductor substrate. The floating gate electrode together with the source and drain regions form an enhancement transistor. Typically, the floating gate electrode may be formed of polysilicon.

In a floating gate flash device, electrons are transferred to the floating gate electrode through a dielectric layer overlying the channel region of the enhancement transistor. The electron transfer is initiated by either hot electron injection, or by Fowler-Nordheim tunneling. In either electron transfer mechanism, a voltage potential is applied to the floating gate electrode by an overlying control gate electrode. The control gate electrode is capacitively coupled to the floating gate electrode, such that a voltage applied on the control gate electrode is coupled to the floating gate electrode. The floating gate flash device is programmed by applying a high positive voltage to the control gate electrode, and a lower positive voltage to the drain region, which transfers electrons from the channel region to the floating gate electrode.

The control gate electrode is separated from the floating gate electrode by an interpoly dielectric layer, typically an oxide-nitride-oxide stack, i.e., an ONO structure or layer. However, as device dimensions continue to be reduced, the electrical thickness of the interpoly dielectric layer between the control gate electrode and the floating gate electrode must be reduced accordingly. Previously, this has been accomplished by scaling down the physical thickness of the ONO layer. However, as the ONO layer is made physically thinner, leakage current through the ONO layer may increase, which limits the scaling down of the total physical thickness of the ONO layer.

Some of the improvements in devices can be addressed through development of materials and processes for fabricating the ONO layer. Recently, development efforts have focused on novel processes and materials for use in fabrication of the ONO layer. While the recent advances in EEPROM technology have enabled memory designers to double the memory capacity of EEPROM arrays using two-bit data storage, numerous challenges exist in the fabrication of material layers within these devices. In particular, the ONO layer must be carefully fabricated to avoid an increase in the leakage current. Accordingly, advances in ONO fabrication and materials technology are needed to ensure proper charge isolation in ONO structures used in MIRRORBIT™ two-bit EEPROM devices and in floating gate flash devices.

DISCLOSURE OF INVENTION

In one embodiment, the present invention relates to a semiconductor device including a modified ONO structure, wherein the modified ONO structure comprises a bottom dielectric material layer, a silicon nitride layer on the bottom dielectric material layer, and a top dielectric material layer on the silicon nitride layer, in which at least one of the bottom dielectric material layer and the top dielectric material layer comprises a composite dielectric material, and in which the composite dielectric material comprises elements of at least one mid-K or high-K dielectric material.

In another embodiment, the present invention relates to a non-volatile memory cell including a) a substrate comprising a source region, a drain region, and a channel region positioned therebetween; b) a floating gate positioned above the channel region and separated from the channel region by a tunnel dielectric material layer; and c) a control gate positioned above the floating gate and separated from the floating gate by an interpoly dielectric layer, the interpoly dielectric layer comprising a bottom dielectric material layer adjacent to the floating gate, a top dielectric material layer adjacent to the control gate, and a center layer comprising silicon nitride and positioned between the bottom dielectric material layer and the top dielectric material layer, in which at least one of the bottom dielectric material layer and the top dielectric material layer comprises a mid-K or high-K dielectric material.

In another embodiment, the present invention relates to a non-volatile memory cell including a) a substrate comprising a source region, a drain region, and a channel region positioned therebetween; b) a charge storage layer comprising a modified ONO structure, the modified ONO structure having a bottom dielectric material layer adjacent the channel region, a top dielectric material layer, and a center charge storage layer comprising silicon nitride and positioned between the bottom dielectric material layer and the top dielectric material layer, in which at least one of the bottom dielectric material layer and the top dielectric material layer comprises a mid-K or high-K dielectric material; and c) a gate capacitively coupled to the channel region through the charge storage layer.

In one embodiment, the present invention relates to a process for fabrication of a semiconductor device comprising a non-volatile memory cell having a modified ONO structure, comprising forming the modified ONO structure by steps comprising providing a semiconductor substrate; forming a first dielectric material layer on the semiconductor substrate; depositing a silicon nitride layer on the first dielectric material layer; and depositing a top dielectric material layer on the silicon nitride layer, in which at least one of the bottom dielectric material layer and the top dielectric material layer comprises a mid-K or high-K dielectric material.

In another embodiment, the present invention relates to a process for fabrication of a semiconductor device, the device including a two-bit EEPROM device including a modified ONO structure, comprising forming the modified ONO structure by steps comprising providing a semiconductor substrate; forming a tunnel dielectric material layer overlying the semiconductor substrate; depositing a silicon nitride layer overlying the tunnel dielectric material layer; and depositing a top dielectric material layer overlying the silicon nitride layer, in which at least one of the bottom dielectric material layer and the top dielectric material layer comprise a mid-K or a high-K dielectric material.

In another embodiment, the present invention relates to a process for fabrication of a semiconductor device, the device including a floating gate flash structure comprising a modified ONO structure, comprising forming the modified ONO structure by steps comprising providing a semiconductor substrate having a floating gate electrode; forming a bottom dielectric material layer overlying the floating gate electrode; depositing a silicon nitride layer overlying the tunnel dielectric material layer; and depositing a top dielectric material layer overlying the silicon nitride layer, in which at least one of the bottom dielectric material layer and the top dielectric material layer comprise a mid-K or a high-K dielectric material.

Thus, in the present invention, by use of a mid-K or a high-K dielectric material instead of silicon dioxide for the top oxide layer, a modified ONO structure may be fabricated having reduced dimensions without creation of interface states coming from contamination which could provide charge leakage paths within the modified ONO structure and without sacrificing the charge trapping ability of the modified ONO structure in the two-bit EEPROM device. The present invention provides advantages such as (1) reduction of equivalent oxide thickness of ONO in next generation devices; (2) high-K film devices are expected to have improved data retention and reliability; and (3) the high-K dielectric material layer replacing one of both silicon dioxide layers allows fabrication of an ONO layer which is physically thicker, resulting in fewer charge leakage paths within the modified ONO structure. A variety of mid-K, high-K or composite dielectric materials may be used for replacement of at least one of the bottom or top oxide layers of an ONO structure, to obtain the modified ONO structure. These dielectric materials may be formed in a nanolaminate, allowing for exact selection of composition, thickness and K value of the modified ONO structure. Thus, the present invention provides an advance in ONO fabrication technology, and ensures proper charge isolation in modified ONO structures used in MIRRORBIT™ two-bit EEPROM devices, and ensures proper dielectric separation of the control gate electrode from the floating gate electrode in a floating gate flash device, while at the same time providing distinct process and economic advantages.

Although described herein in terms of MIRRORBIT™ two-bit EEPROM devices and floating gate flash devices, the present invention is broadly applicable to fabrication of any semiconductor device that includes an ONO structure.

Figure 1:
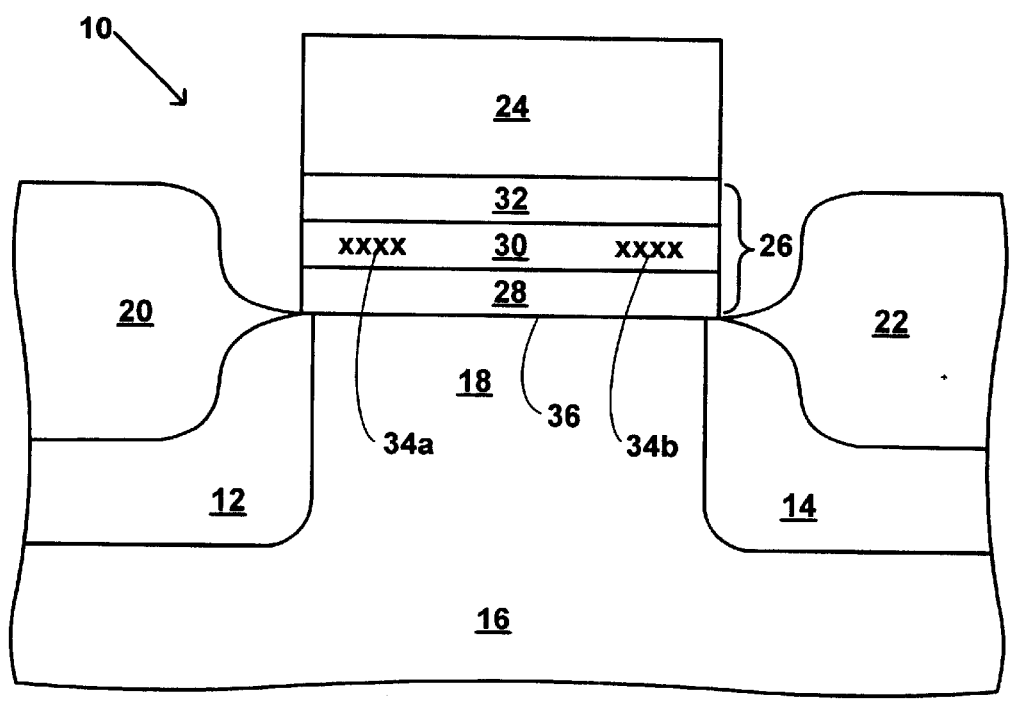
FIG. 1 schematically illustrates, in cross-section, a portion of a semiconductor substrate containing a two-bit EEPROM transistor which incorporates a modified ONO structure fabricated in accordance with the invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

MODES FOR CARRYING OUT THE INVENTION

Referring first to FIG. 1, there is schematically shown in cross-section a transistor 10 suitable for use in a two-bit EEPROM device, such as the MIRRORBIT™ device. The transistor 10 includes source/drain regions 12 and 14 located in a semiconductor substrate 16 and separated by a channel region 18. First and second bit line oxide regions 20 and 22 overlie source/drain regions 12 and 14, respectively. A gate electrode 24 overlies the channel region 18 and is separated therefrom by a modified ONO structure 26. The gate electrode 24 and the modified ONO structure 26 form a stacked-gate structure. The modified ONO structure 26 includes a first or tunnel dielectric material layer 28, a silicon nitride layer 30 and a top dielectric material layer 32, in that order, as shown in FIG. 1. At least one of the top dielectric material layer 32 and the bottom dielectric material layer 28 comprises a mid-K or high-K dielectric material, which replaces the conventional silicon dioxide material in these layers. Thus, the top dielectric material layer 32 may comprise a mid-K or high-K dielectric material, the bottom dielectric material layer 28 may comprise a mid-K or high-K dielectric material, or both the top and the bottom layers 32 and 28 may comprise a mid-K or high-K dielectric material.

Figure 2:
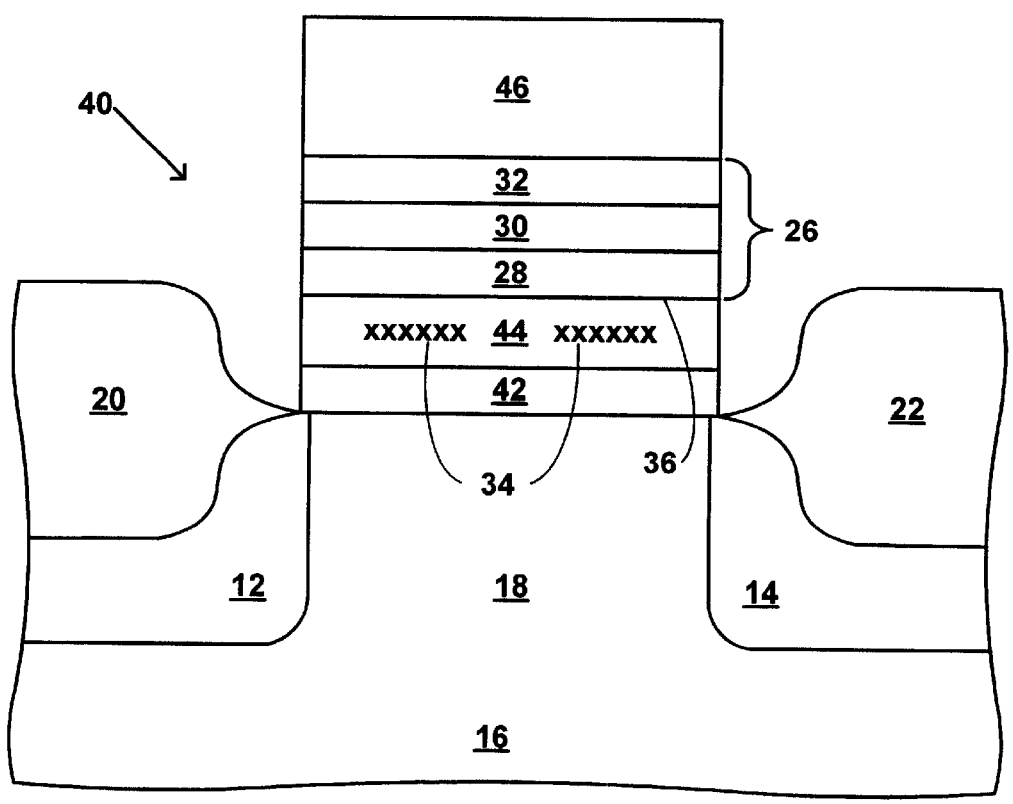
FIG. 2 schematically illustrates, in cross-section, a portion of a semiconductor device containing a floating gate flash transistor which incorporates a modified ONO structure fabricated in accordance with the invention.

Referring next to FIG. 2, there is schematically shown in cross-section a transistor 40 suitable for use in a floating gate flash EEPROM device. The transistor 40 includes source/drain regions 12 and 14 located in a semiconductor substrate 16 and separated by a channel region 18. First and second bit line oxide regions 20 and 22 overlie source/drain regions 12 and 14, respectively. A tunnel dielectric material layer 42 overlies the channel region 18. A floating gate electrode 44 overlies the tunnel dielectric material layer 42. In one embodiment, the tunnel dielectric material layer 42 is silicon dioxide. In another embodiment, the tunnel dielectric material layer 42 comprises a mid-K or a high-K dielectric material. In another embodiment, the tunnel dielectric material layer 42 is a standard-K dielectric material other than silicon dioxide, such as aluminum oxide or silicon oxynitride.

The floating gate electrode 44 is separated from a control gate electrode 46 by an interpoly dielectric layer which comprises a modified ONO structure 26. The control gate electrode 46, the modified ONO structure 26 and the floating gate electrode 44 form a floating gate flash memory structure. The modified ONO structure 26 in FIG. 2 is substantially the same as the modified ONO structure 26 shown in FIG. 1, except that the first dielectric material layer 28 in FIG. 2 may be referred to as a bottom dielectric material layer 28. Like the modified ONO structure shown in FIG. 1, the modified ONO structure shown in FIG. 2 includes a mid-K or high-K dielectric material in at least one of the top dielectric material layer 32 or the bottom dielectric material layer 28, or both, in which the mid-K or high-K dielectric material replaces the conventional silicon dioxide.

As used herein, the term "standard-K dielectric material" refers to a dielectric material having a K up to about 10. Such standard-K dielectric materials include, for example, silicon dioxide, which has a K of about 4, silicon oxynitride, which has a K of about 4–8 depending on the relative content of oxygen and nitrogen, and silicon nitride, which has a K of about 6–9, and aluminum oxide, which has a K of about 10.

As used herein, the term "mid-K dielectric material" refers to a dielectric material having a K in the range from greater than 10 to about 20. Such mid-K dielectric materials include, for example, composite materials such as hafnium silicate, which has a K of about 14, and hafnium silicon oxynitride, which has a K of about 16, depending on the relative content of oxygen and nitrogen, and hafnium silicon nitride, which has a K of about 18.

As used herein, the term "high-K dielectric material" refers to a dielectric material having a K of about 20 or more. Such high-K dielectric materials include, for example, $HfO_2$, $ZrO_2$ and others, some of which are identified more fully below. In general, the term "high-K dielectric material" encompasses binary, ternary and higher oxides and any ferroelectric material having a K of about 20 or more.

As used herein, the term "composite dielectric material" refers to a dielectric material comprising the elements of at least two other dielectric materials. A composite dielectric material may have a K value of a standard-K, mid-K or high-K dielectric material, depending on the elements combined to form the composite dielectric material. As described in more detail below, a composite dielectric material may be formed by co-deposition of its component elements, or by sequential deposition followed by a treatment step, e.g., thermal treatment, to combine the elements to form the composite dielectric material.

Regarding dielectric constants, or K values, silicon dioxide (sometimes simply referred to as "oxide") has a K value of approximately 4, while other dielectric materials have higher K values. Silicon nitride ("nitride"), for example, has a K of about 6 to 9 (depending on formation conditions). Much higher K values of, for example, 20 or more can be obtained with various transition metal oxides including hafnium oxide ($HfO_2$), zirconium oxide, ($ZrO_2$), tantalum oxide ($Ta_2O_5$), barium strontium titanate ("BST"), lead zirconate titanate ("PZT"), and others described more fully below. Using a high-K dielectric material for full or partial replacement of at least one of the top oxide layer 32 and the bottom oxide layer 28 to form the modified ONO structure 26 allows a low electrical thickness to be achieved even with a physically thick layer. For example, a high-K dielectric material gate dielectric with a K of 40 and a thickness of 100 angstroms is substantially electrically equivalent to a silicon dioxide gate dielectric (K about 4) having a thickness of about 10 angstroms. The electrically equivalent thickness of high-K materials may be referred to in terms of the equivalent oxide thickness. Thus, the high-K dielectric material gate dielectric with a K of 40 having a given physical thickness has an equivalent oxide thickness which is approximately $1/10$ the given physical thickness. For higher-K dielectric materials, thicker gate dielectric layers can be formed while maintaining equivalent oxide thickness values lower than are possible with very thin oxide layers. In this way, the reliability problems associated with very thin dielectric layers may be avoided while transistor performance is increased.

Approximate K-values or, in some cases, a range of K-values, are shown below in Table 1 for several exemplary dielectric materials. It is understood that the present invention is not limited to the specific dielectric materials disclosed herein, but may include any appropriate standard-K, mid-K, high-K and composite dielectric materials which are known and are compatible with the remaining elements of the semiconductor device with which the dielectric materials are to be used.

TABLE 1

| Dielectric Material | Approximate Dielectric Constant (K.) (Relative Permittivity) |
|---|---|
| silicon dioxide | 4 |
| silicon nitride | 6–9 |
| silicon oxynitride | 4–8 |
| aluminum oxide | 10 |
| zirconium silicate | 12 |
| hafnium silicate | 15 |
| lanthanum oxide, $La_2O_3$ | 20–30 |
| hafnium oxide, $HfO_2$ | 40 |
| zirconium oxide, $ZrO_2$ | 25 |
| cerium oxide, $CeO_2$ | 26 |
| bismuth silicon oxide, $Bi_4Si_2O_{12}$ | 35–75 |
| titanium dioxide, $TiO_2$ | 30 |
| tantalum oxide, $Ta_2O_5$ | 26 |
| tungsten oxide, $WO_3$ | 42 |
| yttrium oxide, $Y_2O_3$ | 20 |
| $LaAlO_3$ | 25 |
| BST $(Ba_{1-x}Sr_xTiO_3)$ | ~20—200 |
| $PbTiO_3$ | ~20—200 |
| $BaTiO_3$ | ~20—200 |
| $SrTiO_3$ | ~20—200 |
| $PbZrO_3$ | ~20—200 |
| PST $(PbSc_xTa_{1-x}O_3)$ | ~200—3000 |
| PZN $(PbZn_xNb_{1-x}O_3)$ | ~200—5000 |
| PZT $(PbZr_xTi_{1-x}O_3)$ | ~100—1000 |
| PMN $(PbMg_xNb_{1-x}O_3)$ | ~200—5000 |

It is noted that the K-values, or relative permittivity, for both standard-K and high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, hafnium oxide, when stoichiometrically exact, has the chemical formula $HfO_2$. As used herein, the term "hafnium oxide" may include variants of stoichiometric $HfO_2$, which may be referred to as $Hf_xO_y$, in which either of x or y vary by a small amount. For example, in one embodiment, x may vary from about 0.75 to about 1.5, and y may vary from about 1.5 to about 3. In another embodiment, x may vary from about 0.9 to about 1.2, and y may vary from about 1.8 to about 2.2. Such variations from the exact stoichiometric formula fall within the definition of hafnium oxide. Similar variations from exact stoichiometry are included when the chemical formula for a compound is used. For example, again using hafnium oxide as an example, when the formula $HfO_2$ is used, $Hf_xO_y$ as defined above, is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Here and in all numerical values in the specification and claims, the limits of the ranges and ratios may be combined.

The following description of the devices and processes of the present invention are given in the context of a modified ONO structure suitable for use in a two-bit EEPROM device, such as the MIRRORBIT™ two-bit EEPROM device. It is to be understood that, while the present invention is discussed herein in that context, that this is merely exemplary and is not intended to limit the scope of the present invention. The modified ONO structure fabricated by the presently disclosed method is applicable to any semiconductor device in which an ONO structure may be included, and is particularly applicable also to the floating gate flash device described above with reference to FIG. 2.

Referring to FIG. 1, the modified ONO structure 26 includes a first dielectric material layer 28 (tunnel dielectric material layer 28 in a two-bit EEPROM device or bottom dielectric material layer 28 in the floating gate device) overlying the channel region 18. The first dielectric material layer is conventionally silicon dioxide, but in the present invention the silicon dioxide may be fully or partially replaced with a mid-K or a high-K dielectric material. A layer 30 typically comprising silicon nitride overlies the first dielectric material layer 28. A top dielectric material layer 32 which may comprise a mid-K or a high-K dielectric material overlies the silicon nitride-comprising layer 30.

In the operation of the exemplary two-bit EEPROM transistor 10 shown in FIG. 1, voltages are applied to the gate electrode 24 and to the source/drain regions 12 and 14. The applied voltages cause electrical charge from the source/drain regions 12 and 14 to propagate across the channel region 18. Once the charge encounters a sufficiently strong vertical field, the charge is either injected or tunnels from the channel region 18 into the silicon nitride charge storage layer 30. For example, depending upon the particular voltage levels applied to the control-gate electrode 24 and to the source/drain regions 12 and 14, electrical charges 34a, 34b are transferred into the layer 30 and are localized to regions in proximity to either the source/drain region 12, or the source/drain region 14. The electrical charges 34a and 34b each represent a single bit stored in the non-volatile memory cell.

Those skilled in the art will recognize that for proper functioning of a two-bit EEPROM device, the electrical charges 34a and 34b should remain isolated in the regions of the layer 30 to which each is initially introduced. The proper maintenance of the electrical charges 34a, 34b in localized regions of the layer 30 is needed for the proper performance of the two-bit EEPROM device. In particular, the quality of the modified ONO structure 26 should be such that charge leakage paths are minimized at the interface between the layer 30 and each of the tunnel dielectric material layer 28 and the top dielectric material layer 32, at least one of which includes a mid-K or high-K dielectric material in the present invention. Additionally, the each of the bottom dielectric material layer 28 and the top dielectric material layer 32 should be of sufficient density that charge trapping sites are minimized within the high-K dielectric material.

Referring to FIG. 2, the modified ONO structure 26 includes a first dielectric material layer 28 (tunnel dielectric material layer 28 in a two-bit EEPROM device or bottom dielectric material layer 28 in the floating gate device) overlying the floating gate electrode 44. The first dielectric material layer is conventionally silicon dioxide, but in the present invention the silicon dioxide may be fully or partially replaced with a mid-K or a high-K dielectric material. A layer 30 typically comprising silicon nitride overlies the first dielectric material layer 28. A top dielectric material layer 32 which may comprise a mid-K or a high-K dielectric material overlies the silicon nitride-comprising layer 30.

In operation of the floating gate flash device 40 shown in FIG. 2, electrons are transferred to the floating gate electrode 44 through the modified ONO structure interpoly dielectric layer 26 from the channel region 18 of the enhancement transistor. A voltage potential is applied to the floating gate electrode 44 by the overlying control gate electrode 46, which is capacitively coupled to the floating gate electrode 44 through the intervening modified ONO structure 26. The floating gate flash device 40 is programmed by applying a high positive voltage to the control gate electrode 46 and a lower positive voltage to the drain region 14, which transfers electrons from the channel region 18 to the floating gate electrode 44. The electrons are stored as a charge 34 in the floating gate electrode 44, as shown in FIG. 2.

It will be recognized that for proper operation of the floating gate flash device 40, the modified ONO structure interpoly dielectric layer 26 must provide effective dielectric separation between the control gate electrode 46 and the floating gate electrode 44. Any reduction in the electrical thickness of the layer 30 results in a reduction of the overall electrical thickness of the interpoly dielectric layer.

In accordance with the present invention, charge leakage within the modified ONO structure 26 is minimized by forming a physically thick top and/or bottom mid-K or high-K dielectric material layer 32 and/or 28 having a low equivalent oxide thickness. The reduced charge leakage and improved floating gate or two-bit EEPROM performance obtained by the present invention can be better understood following a description of a fabrication process for the modified ONO structure carried out in accordance with the invention.

The following description of the present invention follows with reference to FIGS. 3–6. FIG. 7 is a schematic flow diagram showing the steps of the process of the present invention. The following description of the process refers to FIGS. 3–6 sequentially and with reference to FIG. 7 generally. The present invention can be carried out in a cluster tool.

In the first step of the present invention, shown schematically in FIG. 7 as Step S701, a semiconductor substrate is provided. The semiconductor substrate may be any appropriately selected semiconductor substrate known in the art. In one embodiment, the semiconductor substrate is a bulk silicon substrate. In one embodiment, the semiconductor substrate is a silicon-on-insulator semiconductor substrate. In another embodiment, the semiconductor substrate is a p-doped silicon substrate. Suitable semiconductor substrates include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention is not limited to any particular type of semiconductor substrate.

In a floating gate flash device, the semiconductor device provided in the first step of the method comprises not only a silicon substrate 16 but also a tunnel oxide layer 42 and a floating gate electrode 44 which have been formed on the silicon substrate 16. The tunnel oxide layer 42 and the floating gate electrode 46 may be formed appropriately by any process and from any material known in the art. In an embodiment in which the floating gate electrode 44 is formed of polysilicon, it has a silicon surface as described herein. Thus, the following description is applicable generally to a floating gate flash device, as well as to the two-bit EEPROM described above. Thus, the silicon substrate shown in FIGS. 3–6 may be identified by the reference number 16 or 44, as appropriate.

Figure 3:
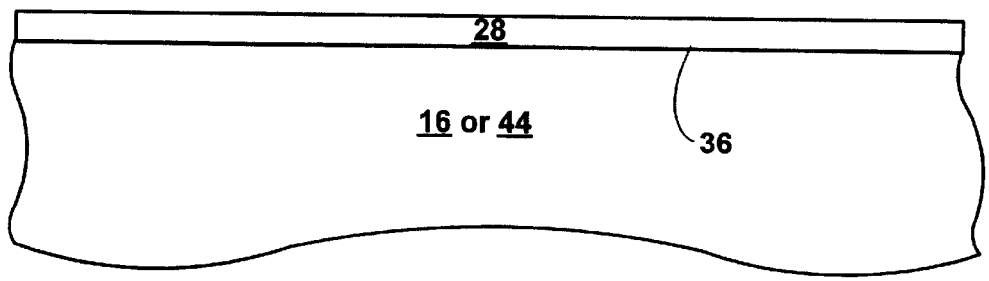
FIGS. 3–6 illustrate, in cross-section, process steps for the fabrication of a modified ONO structure and a gate structure thereover in accordance with the invention.

Referring to FIG. 3, in the second step of the present invention, shown schematically in FIG. 7 as Step S702, a first dielectric material layer 28 is formed on an upper silicon surface 36 of the semiconductor substrate 16. In one embodiment, e.g., a floating gate flash device, the upper silicon surface 36 is the upper surface of a polysilicon floating gate electrode, as shown in FIGS. 2 and 3. In one embodiment, e.g., a two-bit EEPROM device, the semiconductor substrate 16 is a single crystal silicon substrate. The substrate 16 may comprise other structural elements of a semiconductor device. It may, for example, be doped selectively to form a source region and a drain region.

In one embodiment, the silicon surface 36 previously has been processed to remove contaminants and native oxide. A suitable pre-clean procedure includes cleaning the silicon surface 36 with a dilute solution of hydrofluoric acid or any standard cleaning procedure used in the semiconductor industry.

In one embodiment, the bottom dielectric material layer 28 comprises both a high-K dielectric material and a standard-K dielectric material. In one embodiment, the bottom dielectric material layer 28 comprises a mid-K dielectric material. In one embodiment, the bottom dielectric material layer 28 comprises a composite dielectric material, which comprises a composite of elements of, or a reaction product of, two or more dielectric materials, at least one of which is a high-K dielectric material. In one embodiment, the composite dielectric material of which the bottom dielectric material layer 28 is formed is a mid-K dielectric material. The mid-K dielectric material may be a composite of a high-K dielectric material and a standard-K dielectric material. Thus, in one embodiment, the high-K dielectric material completely replaces the silicon dioxide bottom oxide layer of a conventional ONO structure. In another embodiment, the high-K dielectric material is, in essence, added to or combined with, the silicon dioxide bottom oxide layer of a conventional ONO structure to form the bottom dielectric material layer 28 of the modified ONO structure. In another embodiment, the bottom dielectric material layer 28 includes a composite dielectric material comprising elements of at least one high-K dielectric material, which replaces the silicon dioxide layer of a conventional ONO structure.

The first dielectric material layer 28 may be formed either by a growth process (e.g., oxidation of the silicon surface if the first dielectric material layer is to be a conventional oxide layer) or by a deposition process. The following description of methods of forming the bottom dielectric material layer 28 apply equally to forming the top dielectric material layer 32, which is described in more detail below.

In one embodiment, the first dielectric material layer 28 is formed by a deposition process. In one embodiment, the mid-K or high-K dielectric material may be deposited by chemical vapor deposition (CVD). The CVD method may be any appropriate CVD method known in the art for deposition of a high-K material. In one embodiment, the first dielectric material layer 28 is formed by an ALCVD process. In one embodiment, the first dielectric material layer 28 is formed by an MOCVD process. In one embodiment, the first dielectric material layer 28 is formed by an RTCVD process. In one embodiment, the RTCVD deposition is carried out in the same RTP apparatus as that in which the other steps of the process of the present invention are carried out. In one embodiment, the RTP apparatus is part of a single-wafer cluster tool. In one embodiment, the RTCVD process is carried out at a temperature of about 700° C. to about 800° C.

The first oxide can also be formed by depositing the dielectric material layer in a batch furnace by an LPCVD process. In other embodiments, the CVD method may be PECVD or MLD.

The mid-K or high-K dielectric material may be formed by reacting a suitable metal-containing gas, e.g., hafnium tetra-t-butoxide with a suitable oxygen-containing gas, e.g., oxygen ($O_2$) or nitrous oxide ($N_2O$) in, e.g., the CVD apparatus.

In an embodiment in which the CVD is a RTCVD, the RTCVD mid-K or high-K dielectric material deposition may be carried out in three steps including an initial temperature ramp, a deposition step, and cool-down step. In one embodiment, the total reaction time is about 1–3 minutes. In another embodiment, the mid-K or high-K dielectric material deposition step is completed in about 2 minutes.

In one embodiment, the mid-K or high-K dielectric material includes at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$). In addition to the foregoing mid-K or high-K dielectrics, other mid-K or high-K dielectric materials, for example, ferroelectric high-K dielectric materials such as lead lanthanum titanate, strontium bismuth tantalate, bismuth titanate and barium zirconium titanate may be suitably used in the present invention. Other high-K dielectric materials known in the art, including, for example binary and ternary oxides having K values of about 20 or higher, also may be used in the present invention.

In one embodiment, the mid-K or high-K material is a mid-K or high-K material other than tantalum oxide ($Ta_2O_5$). Tantalum oxide has been found, in some embodiments, to exhibit an undesirably high leakage current.

Thus, for example, in an embodiment in which hafnium oxide is the mid-K or high-K dielectric material, the hafnium may be supplied to a suitable CVD apparatus in the form of a hafnium-containing vapor or gas such as hafnium tetra-t-butoxide, and the oxygen is supplied in gaseous form as oxygen, $O_2$ or nitrous oxide, $N_2O$. When a suitable thickness of hafnium oxide has been deposited, the flow of the hafnium-containing vapor or gas and oxygen-containing gas are stopped.

As noted above, in an embodiment in which a plurality of dielectric materials (standard-K, mid-K, high-K or composite) are deposited, alternating sub-layers of each dielectric material may be deposited, or a composite dielectric material which comprises the plurality of dielectric materials may be deposited in a single step. Thus, a first dielectric material precursor may be provided either simultaneously with or sequentially with a second dielectric precursor material. Either the first or the second dielectric precursor material may be a standard-K dielectric precursor or a high-K dielectric precursor, or both may be high-K precursor materials. The process of alternating sub-layer deposition may be continued until a suitable, selected number of sub-layers of desired composition and thickness has been deposited.

In one embodiment, a silicon containing gas, such as $SiH_4$, and a source of oxygen, may be provided together with or alternating with the high-K precursor vapor, during the step of forming the high-K dielectric material sub-layers, in an embodiment in which a composite dielectric material comprising both a high-K dielectric material and a standard-K dielectric material is to be produced. The composite dielectric material may be a mid-K dielectric material.

In one embodiment, a nitrogen-containing gas, such as ammonia ($NH_3$) may be provided along with the silicon-containing gas, oxygen-containing gas and high-K precursor.

In one embodiment, the process is carried out for a period of time and at gas flow rates sufficient to form a mid-K or high-K dielectric material-comprising layer having a thickness of about 25 to about 300 Å. In another embodiment, the process is carried out for a period of time and at gas flow rates sufficient to form a mid-K or high-K dielectric material-comprising layer having a thickness of about 50 to about 200 Å.

In one embodiment, a high-K dielectric material precursor is introduced in the CVD apparatus at a flow rate of about 1 standard liter per minute (slpm) and either oxygen or nitrous oxide is introduced at a flow rate of about 1 slpm. Suitable flow rates of any other gases or vapors provided to the CVD apparatus may be determined by those of skill in the art, based on the composition of the dielectric material layer 28 (and/or layer 32) which is desired.

In one embodiment, the CVD is ALCVD, atomic layer CVD. ALCVD may be used to deposit a dielectric material in layers as thin as a molecular monolayer, which may also be referred to as a nanolayer. Formation of such nano layers allows formation of a nano-laminate structure of any selected dielectric materials. The nano-laminate structure provides for deposition of a plurality of different high-K dielectric materials as sub-layers or nano-layers. The sub-layers may be deposited with single dielectric materials or with a plurality of simultaneously formed dielectric materials. The nano-laminates may thus form a composite high-K dielectric material layer. In one embodiment, sequentially deposited, different dielectric materials may be annealed subsequently to form a composite dielectric material which comprises the elements of the sequentially deposited, different dielectric materials. The conditions of deposition may be suitably selected to provide a nano-lamninate or composite high-K dielectric material layer having a controlled physical thickness, composition and K value.

Thus, for example, ALCVD may be used to deposit alternating monolayers of hafnium oxide and silicon dioxide, in a partial replacement of the top silicon dioxide of a conventional ONO structure with a high-K dielectric material. The alternating layers may be retained, or the structure may be annealed to cause reaction or combination of the elements to form a composite dielectric material which would include the elements Hf/Si/O, i.e., $HfSiO_4$, hafnium silicate. Depending on the relative amounts of hafnium oxide and silicon dioxide deposited, the composite dielectric material may have a formula which varies from the above stoichiometry. Of course, it will be recognized that while the composite material includes the elements of the individual dielectric materials deposited, the exact stoichiometry may vary widely from this example.

As another example, a plurality of high-K dielectric materials may be deposited to replace either or both silicon dioxide layers of the conventional ONO structure in forming the modified ONO structure of the present invention, either simultaneously or in sequentially deposited sub-layers of selected thickness. A combination of high-K dielectric materials may be selected in order to obtain a desired characteristic such as K value, physical thickness, equivalent oxide thickness, or a selected combination of these or other features. The use of ALCVD, with its capability of depositing a molecular monolayer of selected dielectric materials provides a wide range of possible structures for the modified ONO structure.

In another embodiment, the high-K bottom dielectric material layer 28 (and/or the top dielectric material layer 32) may be formed by means of a low-pressure-chemical-vapor-deposition (LPCVD) process. In this alternative embodiment, the high-K dielectric material can be formed in a batch deposition apparatus. In one embodiment, the LPCVD process is carried out at an absolute pressure of about 200 to about 500 millitorr (mtorr), at temperatures of about 700–800° C. using a mid-K or high-K dielectric material precursor and either oxygen or nitrous oxide.

Suitable dielectric precursor materials are known in the art. For example, for hafnium oxide, hafnium tetra-t-butoxide has been mentioned above. For zirconium oxide, a suitable precursor is zirconium tetra-t-butoxide.

In one embodiment, the first dielectric material layer 28 (when silicon dioxide) is formed by in-situ steam generation (ISSG) oxidation of the silicon surface 36 of the semiconductor substrate 16. The ISSG oxidation of the silicon surface 36 may be carried out, for example, in a rapid thermal process (RTP) apparatus. The RTP apparatus may be any such apparatus known in the art. In one embodiment, the RTP apparatus is part of a single-wafer cluster tool.

In one embodiment, the ISSG oxidation of the silicon surface 36 is carried out by placing the wafer in the RTP apparatus and flowing a mixture of oxygen-containing gas and hydrogen-containing gas to the chamber at suitable flow rates and pressure. The temperature of the RTP can be in the range from about 800° C. to about 1150° C. The flow rates and temperature may be suitably selected to provide rapid oxidation of the silicon surface 36, to form an oxide layer of desired thickness.

For the ISSG process, any of the commercially available RTP systems can be utilized. Details of a suitable ISSG process may be found in commonly assigned, copending application U.S. application Ser. No. 10/036,757, filed Dec. 31, 2001. The disclosure of U.S. application Ser. No. 10/036,757 is hereby incorporated herein by reference for its teachings relating to ISSG.

In an alternate embodiment, the first dielectric material layer 28 (when silicon dioxide) may be grown by thermally oxidizing the silicon surface 36 at an elevated temperature in the presence of dry molecular oxygen. In one embodiment, the thermal oxidation is carried out at a temperature in the range of about 900° C. to about 1100° C. The thermal oxidation process may be carried out in either a batch-type thermal oxidation furnace, or alternatively, in a single-wafer oxidation apparatus. In one embodiment, the thermal oxidation is carried out in the same RTP apparatus as that in which the other steps of the present process are carried out. In one embodiment, the RTP apparatus is part of a single-wafer cluster tool.

In one embodiment, the first dielectric material layer 28, when it is a high-K dielectric material, has a thickness in the range from about 20 to about 300 angstroms (Å), and in another embodiment, the first dielectric material layer 28 has a thickness in the range from about 50 to about 200 Å.

Figure 4:
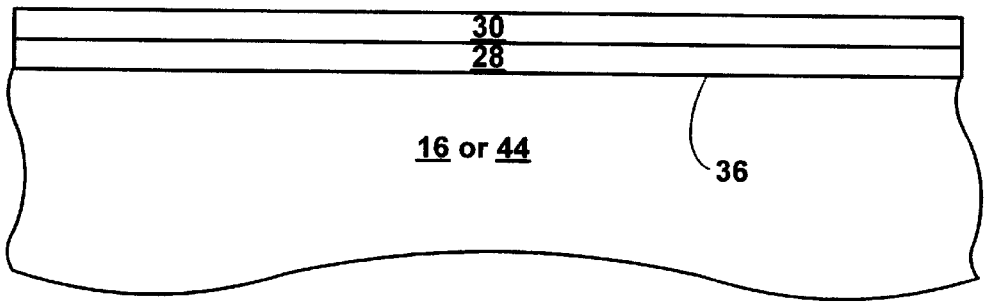

In the third step of the present invention, shown schematically in FIG. 7 as Step S703, a nitride layer 30 is formed on the first oxide layer 28. As shown in FIG. 4, after forming the first oxide layer 28, the nitride layer 30 is deposited on the first oxide layer 28. The nitride layer 30 may be formed by any method known in the art, as appropriate to the device being fabricated.

In one embodiment, the nitride layer 30 is silicon nitride. In another embodiment, the nitride layer 30 is silicon-rich silicon nitride. In other embodiments, the nitride layer 30 may be another suitable charge-storing nitride, such as silicon oxynitride.

In one embodiment, the nitride layer 30 is formed by means of a rapid-thermal-chemical-vapor-deposition (RTCVD) process. In one embodiment, the RTCVD process is carried out at a temperature of about 700° C. to about 800° C. The silicon nitride material may be formed by reacting a suitable nitrogen-containing gas, e.g., ammonia ($NH_3$) with a suitable silicon-containing gas, e.g., dichlorosilane ($SiCl_2H_2$) or silane ($SiH_4$).

In one embodiment, the process is carried out for a period of time and at gas flow rates sufficient to form a silicon nitride layer having a thickness of about 50 to about 200 angstroms. In another embodiment, the process is carried out for a period of time and at gas flow rates sufficient to form a silicon nitride layer having a thickness of about 100 angstroms.

In one embodiment, ammonia is introduced in the RTCVD apparatus at a flow rate of about 1 standard liter per minute (slpm) and either dichlorosilane or silane is introduced at a flow rate of about 30 to about 50 standard-cubic-centimeters-per-minute (sccm). The RTCVD process is carried out in three steps including an initial temperature ramp, a deposition step, and cool-down step. In one embodiment, the total reaction time is about 1–3 minutes. In another embodiment, the silicon nitride deposition step is completed in about 2 minutes.

In another embodiment, the silicon nitride layer 30 may be formed by means of a low-pressure-chemical-vapor-deposition (LPCVD) process. In this alternative embodiment, the silicon nitride can be formed in a batch deposition apparatus. In one embodiment, the LPCVD process is carried out at an absolute pressure of about 200 to about 500 millitorr (mtorr), at temperatures of about 700–800° C. using ammonia and either dichlorosilane or silane gas.

Figure 5:
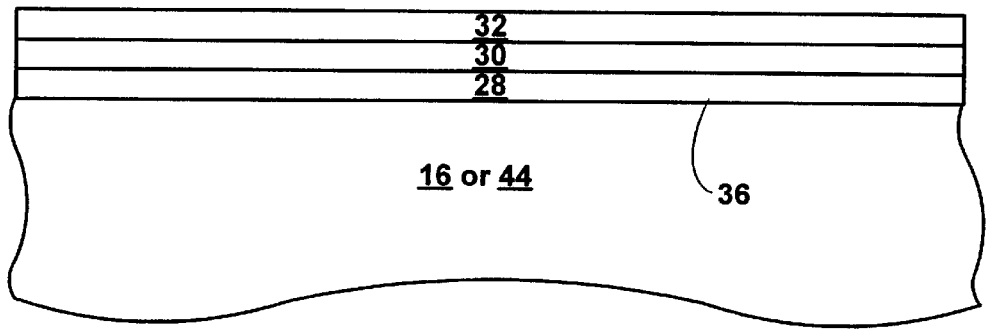

In the fourth step of the present invention, shown schematically in FIG. 7 as Step S704, a top dielectric material layer 32 is formed on the silicon nitride layer 30. In one embodiment, the top dielectric material layer 32 is a mid-K or a high-K dielectric material. In another embodiment, when the bottom dielectric material 28 comprises a mid-K or a high-K dielectric material, the top dielectric material layer 32 is silicon dioxide. In another embodiment, as noted above, both the top dielectric material layer 32 and the bottom dielectric material layer 28 comprise a mid-K or a high-K dielectric material. The mid-K or high-K dielectric material may be formed by an appropriate method known in the art, such as any of those disclosed above with respect to formation of the bottom dielectric material layer 28. As shown in FIG. 5, after depositing the silicon nitride-comprising layer 30, the top dielectric material layer 32, is formed.

In one embodiment, the top dielectric material layer 32 comprises both a high-K dielectric material and a standard-K dielectric material. In one embodiment, the top dielectric material layer 32 comprises a mid-K dielectric material. In one embodiment, the top dielectric material layer 32 comprises a composite dielectric material, which comprises a composite of elements of, or a reaction product of, two or more dielectric materials, at least one of which is a high-K dielectric material. In one embodiment, the composite dielectric material of which the top dielectric material layer 32 is formed is a mid-K dielectric material. The mid-K dielectric material may be a composite of a high-K dielectric material and a standard-K dielectric material. Thus, in one embodiment, the high-K dielectric material completely replaces the silicon dioxide top oxide layer of a conventional ONO structure. In another embodiment, the high-K dielectric material is, in essence, added to or combined with, the silicon dioxide top oxide layer of a conventional ONO structure to form the top dielectric material layer 32 of the modified ONO structure. In another embodiment, the top dielectric material layer 32 includes a composite dielectric material comprising elements of at least one high-K dielectric material, which replaces the silicon dioxide layer of a conventional ONO structure.

In one embodiment, an important feature of the invention includes the sequential formation of the silicon nitride layer 30 and the high-K top dielectric material layer 32 in the absence of exposure of the layer 30 to ambient atmosphere. Following the deposition of the silicon nitride layer 30 onto the first dielectric material layer 28, the top dielectric material layer 32 comprising a mid-K or high-K dielectric material may be formed, e.g., by RTCVD, MOCVD or ALCVD in a single wafer cluster tool, without the necessity of being transferred to a separate oxide deposition chamber, which would entail either maintenance of vacuum conditions without exposing the substrate to ambient atmosphere, or application of a positive-pressure inert gas atmosphere during wafer transfer. Thus, the present invention provides distinct process and economic advantages in formation of a modified ONO structure.

Figure 6:
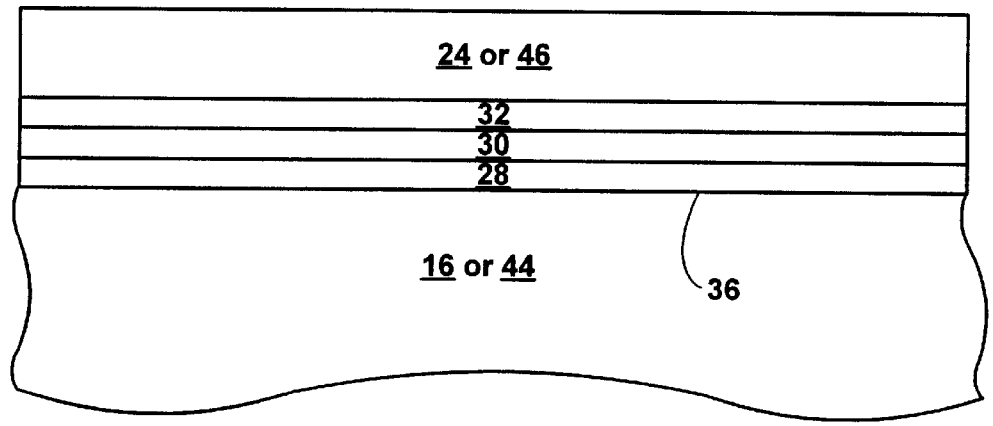
Figure 7:
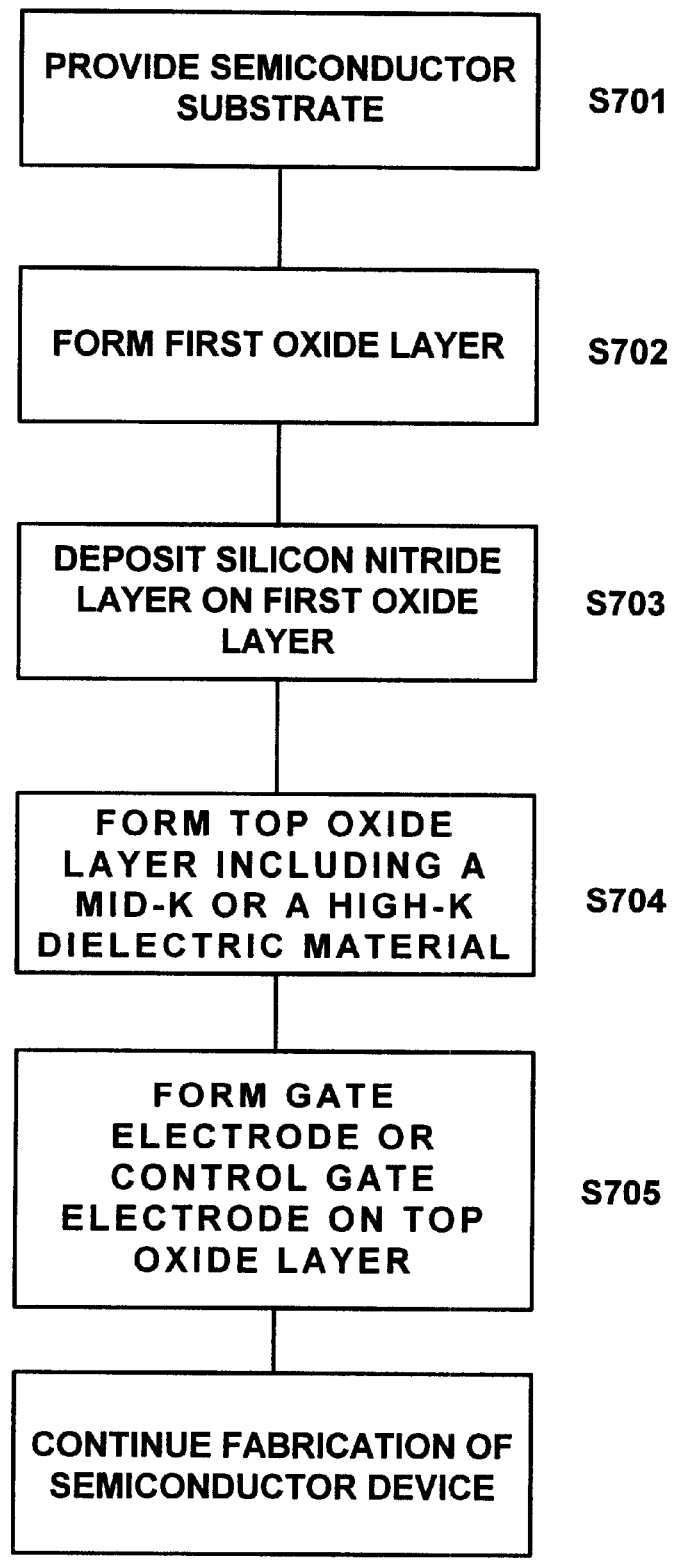
FIG. 7 is a schematic flow diagram showing the steps of the present invention.

As shown in FIG. 6, following formation of the modified ONO structure 26 in accordance with the present invention, shown schematically in FIG. 7 as Step S705, a layer forming a gate electrode 24, in the case of the two-bit EEPROM, is formed on the top dielectric material layer 32. In the case of the floating gate flash device, a control gate electrode 46 is formed on the top dielectric material layer 32. The stacked-gate structures shown in FIGS. 1 and 2 are completed by depositing the layer of gate forming material overlying the top dielectric material layer 32. A lithographic patterning and etching process then may be carried out to define the gate electrode 24 (or control gate electrode 46) and the modified ONO structure 26. Those skilled in the art will recognize that various gate-forming materials can be used to fabricate the gate electrode 24. For example, the gate electrode 24 and the control gate electrode 46 can be formed with polycrystalline silicon, amorphous silicon, a refractory metal silicide, a metal, and the like.

Following formation of the gate electrode 24, or the control gate electrode 46, as appropriate, and the modified ONO structure 26, fabrication of the semiconductor device continues, as indicated in the final step of FIG. 7.

For example, fabrication of the semiconductor device may include annealing the device in order to densify the silicon dioxide and/or mid-K or high-K dielectric material layers and/or to further form the composite dielectric material of either or both of the bottom dielectric material layer 28 and the top dielectric material layer 32, in which the dielectric material layer comprises a mid-K or a high-K dielectric material.

Figure 8:
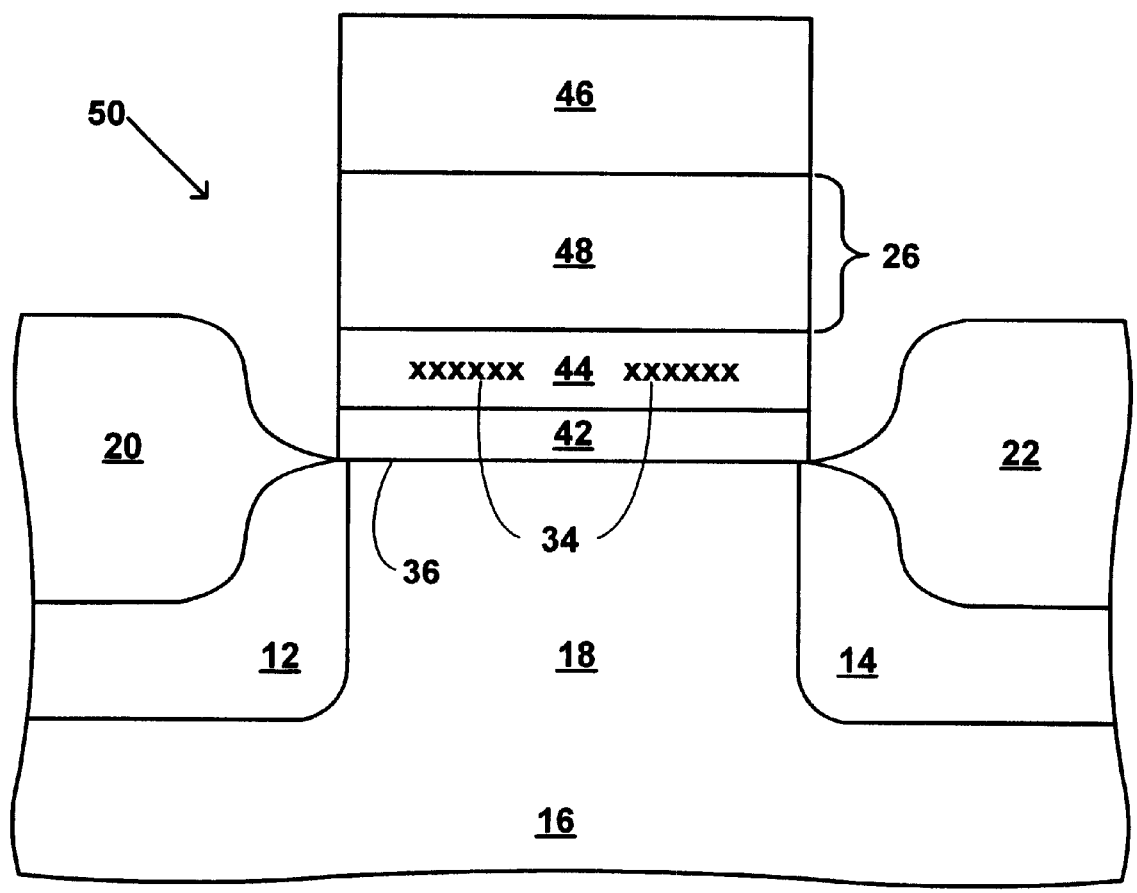
FIG. 8 schematically illustrates, in cross-section, a portion of a floating gate flash memory device fabricated in accordance with another embodiment of the present invention.

FIG. 8 shows an embodiment of the present invention in which a floating gate flash memory device, having a modified ONO structure as described herein, has been annealed to form a composite dielectric material of the combined layers 28, 30 and 32, in which the modified ONO structure includes at least one of the top dielectric material layer 28 and the bottom dielectric material layer 32 were originally comprised of a mid-K or a high-K dielectric material, and the other layers are as described herein.

In this embodiment, a non-volatile memory cell 50 (here a floating gate memory cell) is formed which includes a) a substrate 16 including a source region 12, a drain region 14, and a channel region 18 positioned therebetween; b) a floating gate 44 positioned above the channel region 18 and separated from the channel region 18 by a tunnel dielectric film 42; and c) a control gate 46 positioned above the floating gate 44 and separated from the floating gate 44 by an interpoly dielectric layer 26. In this embodiment, the interpoly dielectric layer 26 includes a single layer 48 adjacent to both the floating gate 42 and the control gate 46. In this embodiment, the single layer 48 is a dielectric material which is a metal silicate, a metal aluminate or a metal mixed-aluminate/silicate. Thus, for example, using hafnium as the exemplary metal, the dielectric material forming the layer 48 may be hafnium silicate ($HfSiO_4$), hafnium aluminate ($HfAl_2O_5$) or a hafnium mixed-aluminate/silicate, $HfO_2/SiO_2/Al_2O_3$, which may have a formula such as $Hf_2Si_2Al_2O_{11}$. The single dielectric material comprises the elements of the high-K dielectric material of which at least one of the top and bottom dielectric material layers were formed, the silicon nitride layer 30, and any silicon dioxide which may have formed either of the top or bottom dielectric material layer which was oxide, rather than a mid-K or high-K dielectric material.

Suitable metals for the metal silicate, metal aluminate or metal mixed-aluminate/silicate include, for example, hafnium, zirconium, yttrium, cerium, tantalum, titanium, lanthanum, tungsten, bismuth, barium, strontium, scandium, niobium or lead, or mixtures thereof. Other metals which, when combined with silicon dioxide or aluminum oxide, or a mixture thereof, yield a material having a K value greater than about 10 may be suitable. The metal silicate, metal aluminate or metal mixed-aluminate/silicate substantially should not react with silicon (or polysilicon) at temperatures of about 600–800° C.

There has been disclosed in accordance with the invention a process for fabricating an ONO floating-gate electrode in both a MIRRORBIT™ two-bit EEPROM device and a floating gate flash device, both of which provide the advantages set forth above (as appropriate). As noted above, the process of the invention is also applicable to other semiconductor devices which include an ONO structure.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the thicknesses of the individual layers making up the modified ONO structure can be varied from that described herein. In another variation, the composition of the other layers of the ONO structure or the stacked gate structure may be varied from, e.g., silicon dioxide or silicon nitride to other materials. It is therefore intended to include within the invention all such variations and modifications that fall within the scope of the appended claims and equivalents thereof.

INDUSTRIAL APPLICABILITY

Thus, in accordance with the present invention, a semiconductor device including a modified ONO structure is provided which may be fabricated without creation of interface states that could provide charge leakage paths within the modified ONO structure. The present invention can be carried out in a cluster tool. The present invention provides advantages such as (1) formation of a cleaner interface between layers of the modified ONO structure, resulting in fewer interface states that could provide charge leakage paths; (2) use of a high-K dielectric material, which allows formation of a physically thicker ONO structure having a lower equivalent oxide thickness; and (3) an efficient process which may be carried out in a single device, such as a cluster tool. Thus, the present invention provides an advance in dielectric fabrication technology, and ensures proper charge storage and isolation in modified ONO structures used in MIRRORBIT™ two-bit EEPROM devices, and ensures proper dielectric separation of the control gate electrode from the floating gate electrode in floating gate flash devices, while at the same time providing distinct process and economic advantages. Although described in terms of, and particularly applicable to, two-bit EEPROM devices, the present invention is broadly applicable to fabrication of any semiconductor device including a modified ONO structure.

What is claimed is:

1. A semiconductor device comprising a modified ONO structure, wherein the modified ONO structure comprises a bottom dielectric material layer, a nitride layer on the bottom dielectric material layer, and a top dielectric material layer on the nitride layer, in which at least one of the bottom dielectric material layer and the top dielectric material layer comprises a composite dielectric material, wherein the composite dielectric material comprises elements of at least one mid-K or high-K dielectric material, wherein each mid-K or high-K dielectric material independently comprises at least one of hafnium oxide ($HfO_2$), zirconium oxide ($ZrO_2$), barium titanate ($BaTiO_3$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$).

2. A non-volatile memory cell comprising:
a) a substrate comprising a source region, a drain region, and a channel region positioned therebetween;
b) a floating gate positioned above the channel region and separated from the channel region by a tunnel dielectric material layer; and
c) a control gate positioned above the floating gate and separated from the floating gate by an interpoly dielectric layer, the interpoly dielectric layer comprising a modified ONO structure having a bottom dielectric material layer adjacent to the floating gate, a top dielectric material layer adjacent to the control gate, and a center layer comprising a nitride and positioned between the bottom dielectric material layer and the top dielectric material layer, wherein at least one of the bottom dielectric material layer and the top dielectric material layer comprises a mid-K or high-K dielectric material, and at least one of the bottom dielectric material layer or the top dielectric material layer comprises a composite dielectric material including elements of a high-K dielectric material and at least one additional dielectric material,
wherein each mid-K or high-K dielectric material independently comprises at least one of hafnium oxide ($HfO_2$), zirconium oxide ($ZrO_2$), barium titanate ($BaTiO_3$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$).

3. The non-volatile memory cell of claim 2, wherein both of the bottom dielectric material layer and the top dielectric material layer comprise a composite dielectric material including elements of a high-K dielectric material and at least one additional high-K dielectric material.

4. A non-volatile memory cell comprising:
a) a substrate comprising a source region, a drain region, and a channel region positioned therebetween;
b) a charge storage layer comprising a modified ONO structure, the modified ONO structure having a bottom dielectric material layer adjacent the channel region, a top dielectric material layer, and a center charge storage layer comprising a nitride and positioned between the bottom dielectric material layer and the top dielectric material layer, wherein at least one of the bottom dielectric material layer and the top dielectric material layer comprises a mid-K or high-K dielectric material, wherein each mid-K or high-K dielectric material independently comprises at least one of hafnium oxide ($HfO_2$), zirconium oxide ($ZrO_2$), barium titanate ($BaTiO_3$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$); and
c) a gate capacitively coupled to the channel region through the charge storage layer,
and wherein at least one of the bottom dielectric material layer or the top dielectric material layer comprises a composite dielectric material including elements of the high-K dielectric material and at least one additional dielectric material.

5. The non-volatile memory cell of claim 4, wherein both of the bottom dielectric material layer and the top dielectric material layer comprise a composite dielectric material including elements of a high-K dielectric material and at least one additional high-K dielectric material.

6. The device of claim 1, wherein the device is a two-bit EEPROM device.

7. The device of claim 1, wherein the device is a floating gate flash memory device.

8. The device of claim 1, wherein the nitride layer comprises silicon nitride.

9. The device of claim 1, wherein both of the bottom dielectric material layer and the top dielectric material layer comprise a composite dielectric material.

10. The device of claim 1, wherein the composite dielectric material comprises at least one of hafnium oxide or zirconium oxide or cerium oxide.

11. The device of claim 1, wherein the composite dielectric material is a mid-K dielectric material comprising at least one of silicon or aluminum.

12. The device of claim 2, wherein the center layer comprises silicon nitride.

13. The device of claim 2, wherein both of the bottom dielectric material layer and the top dielectric material layer comprise a mid-K or high-K dielectric material.

14. The device of claim 2, wherein the mid-K or high-K dielectric material comprises at least one of hafnium oxide or zirconium oxide or cerium oxide.

15. The device of claim 2, wherein the mid-K or high-K dielectric material is a mid-K dielectric material comprising at least one of silicon or aluminum.

16. The device of claim 4, wherein the center charge storage layer comprises silicon nitride.

17. The device of claim 4, wherein both of the bottom dielectric material layer and the top dielectric material layer comprise a mid-K or high-K dielectric material.

18. The device of claim 4, wherein the mid-K or high-K dielectric material comprises at least one of hafnium oxide or zirconium oxide or cerium oxide.

19. The device of claim 4, wherein the mid-K or high-K dielectric material is a mid-K dielectric material comprising at least one of silicon or aluminum.

20. The device of claim 1, wherein the composite dielectric material comprises at least one of hafnium oxide or zirconium oxide or cerium oxide and at least one of silicon or aluminum.

21. The non-volatile memory cell of claim 2, wherein the composite dielectric material comprises at least one of hafnium oxide or zirconium oxide or cerium oxide and at least one of silicon or aluminum.

22. The non-volatile memory cell of claim 4, wherein the composite dielectric material comprises at least one of hafnium oxide or zirconium oxide or cerium oxide and at least one of silicon or aluminum.

* * * * *